(12) United States Patent
Huang et al.

(10) Patent No.: US 6,291,260 B1
(45) Date of Patent: Sep. 18, 2001

(54) CRACK-PREVENTIVE SUBSTRATE AND PROCESS FOR FABRICATING SOLDER MASK

(75) Inventors: Chien-Ping Huang, Hsinchu Hsien; April Chen, Taichung; Tzong-Dar Her, Taichuang, all of (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/482,758

(22) Filed: Jan. 13, 2000

(51) Int. Cl.[7] .................................................. H01L 21/44
(52) U.S. Cl. ..................... 438/106; 438/107; 438/108; 438/125; 438/126; 257/678; 257/686; 257/696; 257/723; 257/758; 257/777
(58) Field of Search ..................... 438/106, 107, 438/108, 125, 126; 257/686, 758, 723, 678, 696, 777

(56) References Cited

U.S. PATENT DOCUMENTS

| | | | |
|---|---|---|---|
| 4,652,513 | * | 3/1987 | Pentak et al. .......................... 430/258 |
| 5,625,221 | * | 4/1997 | Kim et al. ............................. 257/686 |
| 5,953,589 | * | 9/1999 | Shim et al. ........................... 438/106 |
| 6,097,091 | * | 8/2000 | Ohsumi ................................ 257/758 |

* cited by examiner

Primary Examiner—Richard Elms
Assistant Examiner—Pho Luu
(74) Attorney, Agent, or Firm—Jiawei Huang; J.C. Patents

(57) ABSTRACT

A crack-preventive substrate for fabricating a solder mask in a device site region includes a substrate, which has a top surface and a bottom surface, and a solder mask layer. The substrate is divided into a device site region and a periphery region. The solder mask layer, disposed on the top surface and bottom surface of the substrate, forms a bare area on the top surface and bottom surface of the substrate by exposing a portion of the substrate on the top surface and bottom surface of the substrate. And the bare areas divide the solder mask layer into a "device site region solder mask layer" and a "periphery region solder mask layer". As a result, the crack lines generated on the solder mask layer at the perimeter of the substrate will not develop toward the solder mask in the device site region.

15 Claims, 3 Drawing Sheets

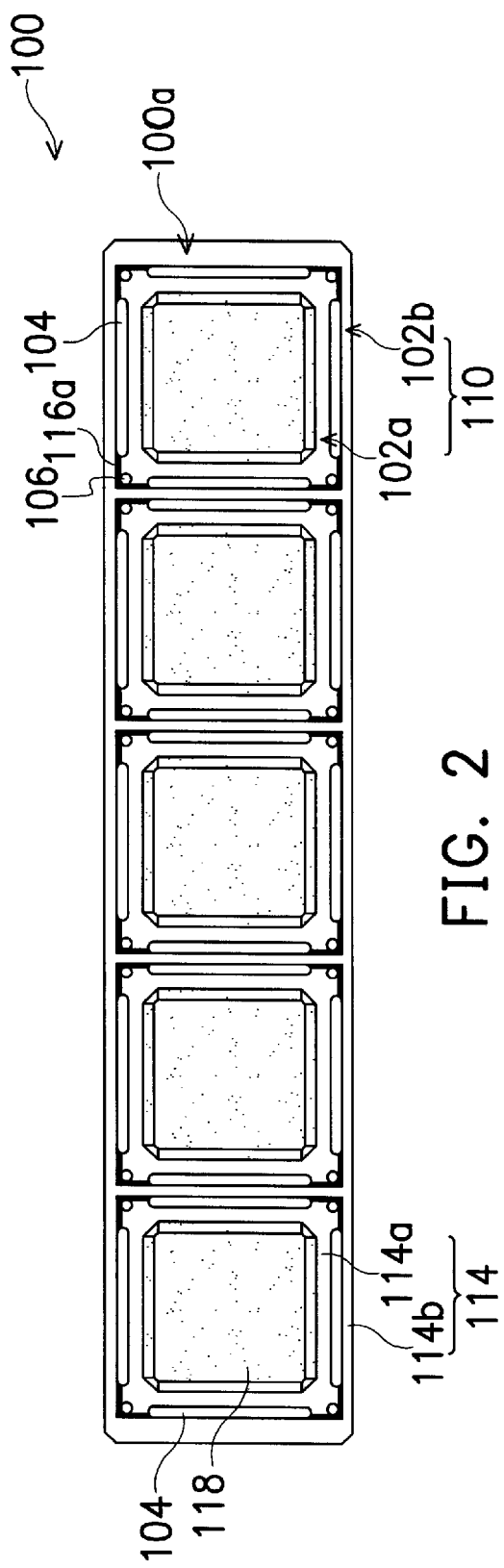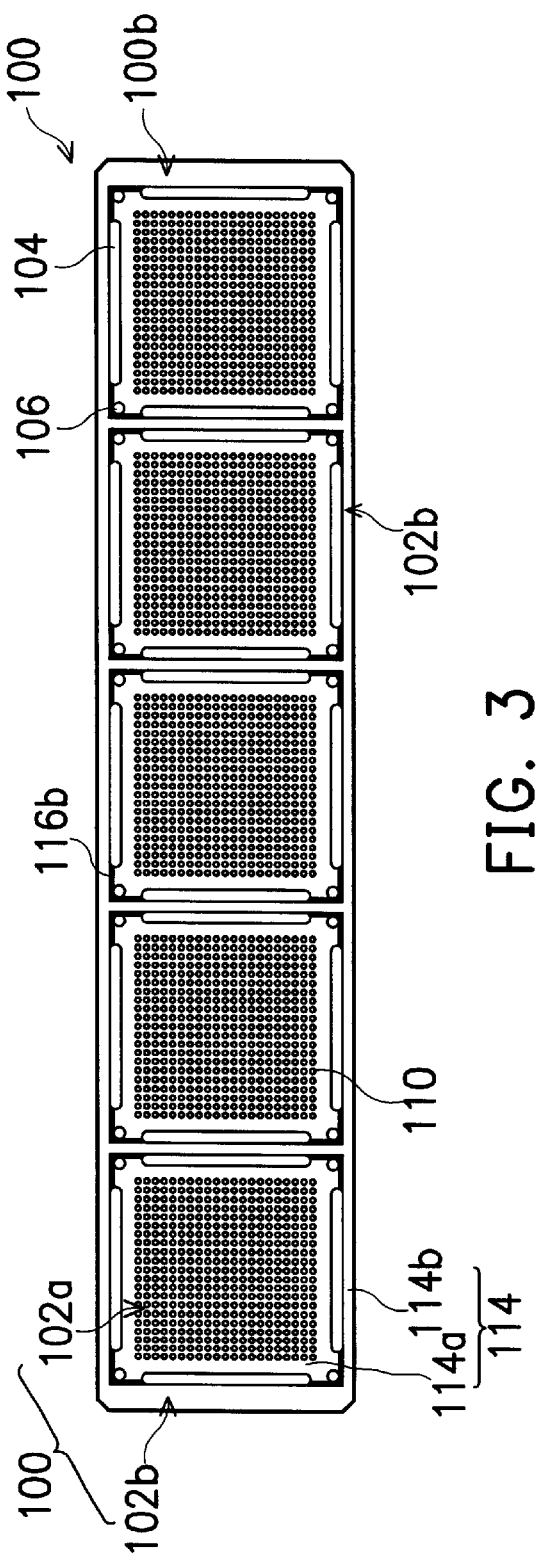

CRACK-PREVENTIVE SUBSTRATE AND PROCESS FOR FABRICATING SOLDER MASK

BACKGROUND OF THE INVENTION

1. Field of the Invention

This invention relates to a crack-preventive substrate and process for fabricating a solder mask, and more particularly to a crack-preventive substrate and process that can prevent the solder mask in the device site region from cracking.

2. Description of Related Art

The packaging process of semiconductor is the final step in manufacturing IC (integrated circuit) products. The objectives of the packaging process of semiconductor are to provide a medium of electrical connection between the die and PCB (printed circuit board) or between the die and other appropriate devices, as well as to protect the die from being damaged or contaminated. As far as the general BGA (Ball Grid Array) packaging process is concerned, the devices are assembled by first mounting the dies on a surface at individual device site on a substrate strip, then, performing electrical connection between the dies and the substrate. Afterwards, the devices are assembled by performing encapsulating process to encase the devices etc. by molding compound, subsequently, performing a solder-ball planting process on the another surface of the substrate strip to form solder balls of BGA package. Finally, a singulating process is performed to separate the encapsulated devices from the substrate strip, thus to complete the assembling process of a BGA package.

In the conventional package, a solder mask layer is formed on each surface of the substrate strip for the purpose of protecting the circuitry on the substrate from being damaged or contaminated during the solder-ball planting process and plating process. In additions, the forming of the solder mask layer is to effectively isolate each of the circuit region lest the unnecessary electrical connections be occurred in order that the substrate has relatively high reliability and yield to facilitate the subsequent packaging process.

In general, the footprint of a die-bonded device site is in rectangular shape, and the device site is connected to the substrate at the four-corner only. Moreover, a typical punching tool for a singulating process has a right-angle cutting edge corresponding to each corner of the device site. In the singulating process, the device will be excised from the substrate through the four-corner of the device site.

During a series of packaging process, the stresses resulted from each handling step and the thermal stresses will generate crack lines on the solder mask layer at the perimeter of the substrate. The crack lines started from the perimeter of the substrate will develop through the connection between the substrate and the device site toward the device site, thereby, will cause the exposure of the circuit region of the device site. Consequently, through the gap of the crack lines, the device will be damaged and contaminated by the exterior moisture, dust etc. that will cause the cracking of the solder mask layer in the subsequent high temperature process, thus the yield will be lowered.

SUMMARY OF THE INVENTION

Therefore, the present invention is to provide a crack-preventive substrate for fabricating a solder mask in a device site region that includes a substrate, which has a top surface and a bottom surface, and a solder mask layer. The substrate is also divided into a device site region and a periphery region. The solder mask layer, disposed on the top surface and bottom surface of the substrate, forms a bare area on the top surface and bottom surface of the substrate by exposing a portion of the substrate on the top surface and bottom surface of the substrate. And the bare areas divide the solder mask layer into a "device site region solder mask layer" and a "periphery region solder mask layer".

The present also provides a crack-preventive process for fabricating a solder mask in a device site region wherein the process comprises firstly providing a substrate that has a top surface and a bottom surface, and the substrate also includes a device site region and a periphery region. Then, the process provides forming a solder mask layer on the top surface and bottom surface of the substrate. The solder mask layer forms a bare area on the top surface and bottom surface of the substrate by exposing a portion of the substrate on the top surface and bottom surface of the substrate. The bare areas divide the solder mask layer into a "device site region solder mask layer" and a "periphery region solder mask layer". Subsequently, the process provides mounting a die in the device site region on the top surface of the substrate. Then, it provides performing an encapsulating process in the device site region on the top surface of the substrate and performing a solder-ball planting process. Finally, the process provides performing a singulating process to separate the device site region and the periphery region.

Normally, crack lines will be generated in the solder mask layer at the perimeter of the substrate by the subsequent processes of die attachment, wire bonding, encapsulating, and solder-ball planting etc. The crack line can also be generated due to the unequal thermal stresses resulted from the difference in the coefficient of thermal expansion of the bonding of the two different kinds material. According to a preferred embodiment of the present invention, the above-mentioned bare area encloses the device site region such that the solder mask in the device site region and the solder mask in the periphery region are separated, thereby, the crack lines. can not develop to the device site region nor can they develop into the encapsulated packages. Therefore, the problems of being relatively low in yield and relatively low in reliability resulted from the crack line generation in the solder mask layer can thus be resolved.

BRIEF DESCRIPTION OF DRAWINGS

The objectives, characteristics, and advantages of the present invention can be more fully understood by reading the following detailed description of the preferred embodiments, with reference made to the accompanying drawings as follows:

FIG. 2 is a top view of the top surface of a substrate strip having the packaging process completed of the present invention.

FIG. 3 is a top view of the bottom surface of a substrate strip having the packaging process completed of the present invention.

DETAILED DESCRIPTION OF PREFERRED EMBODIMENT

Figure 1A:
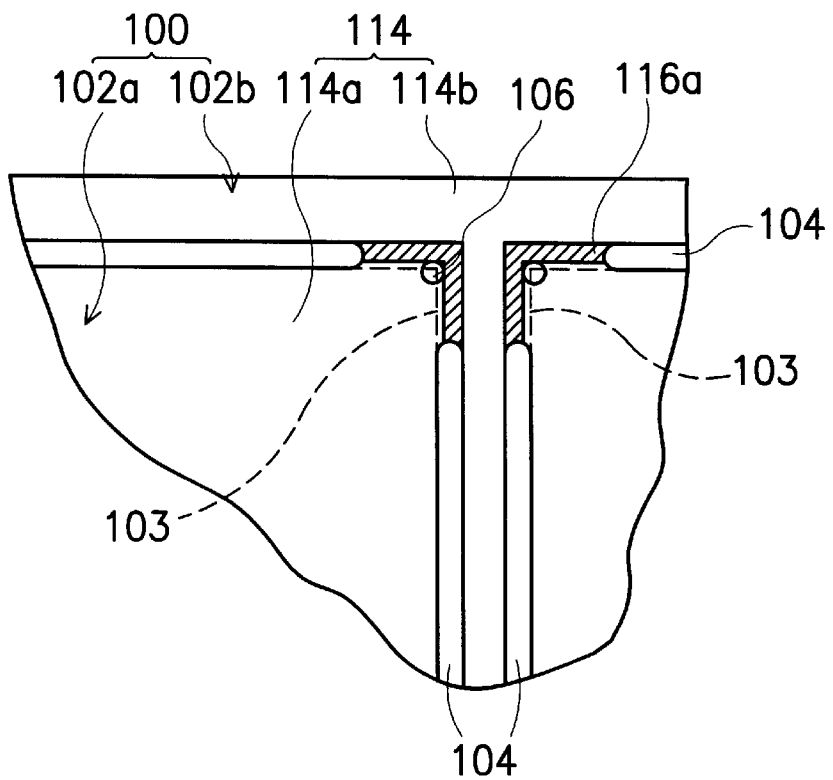
FIG. 1A and FIG. 1B are top views of an enlarged corner portion of the substrate strip of the present invention.
Figure 1B:
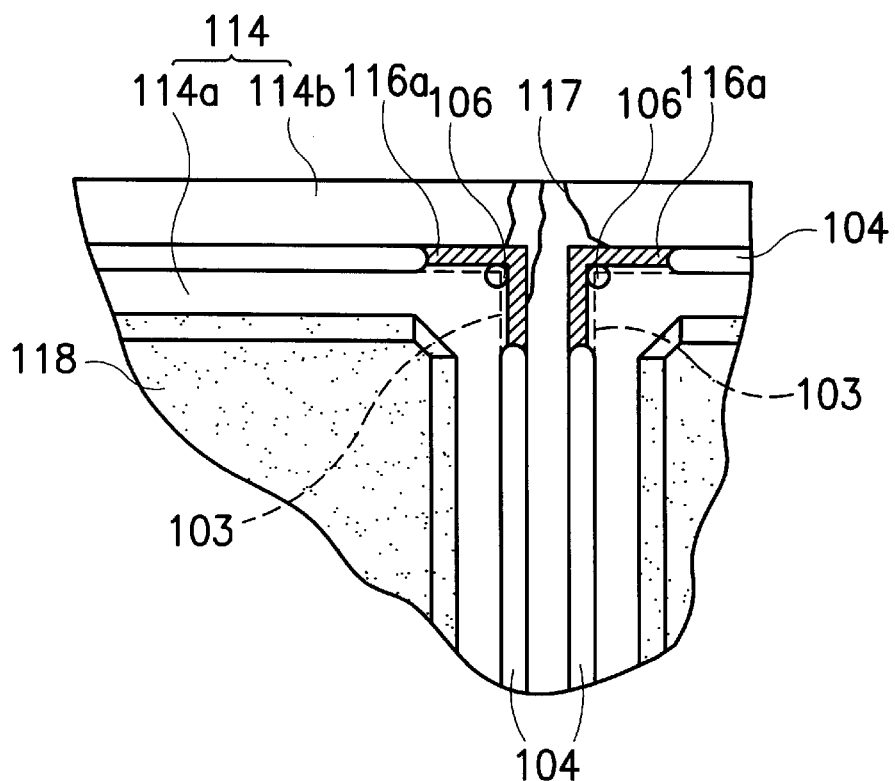

FIG. 1A and FIG. 1B are top views of an enlarged corner portion of the substrate strip of the present invention. FIG.

2 is a top view of the top surface of a substrate strip having the packaging process completed of the present invention. FIG. 3 is a top view of the bottom surface of a substrate strip having the packaging process completed of the present invention. As shown in FIG. 2 and FIG. 3, a substrate 100 having a top surface 100a and a bottom surface 100b is provided wherein the top surface 100a is for the subsequent die attaching process while the bottom surface 100b is for the subsequent solder-ball planting process. The substrate can be a circuit carrier or a die carrier etc. and the material used for the substrate can be a Prepreg like FR-4 that is made of a "flame-retardant epoxy glass fabric composite resin" or a Bismaleimide-Triazine resin.

As shown also in FIG. 1A, and FIG. 1B, the substrate 100 is also divided into a "device site region" 102a and a "periphery region" 102b. A conductive trace (not shown) is formed in the device site region 102a on the top surface 100a for electrical connection, and another conductive trace is also formed in the device site region 102a on the bottom surface 100b for electrically connecting to the circuit board.

Additionally, the substrate 100 also comprises a slender slot 104 and a "scribe line intersected hole" 106, both of them are located between the device site region 102a and the periphery region 102b. A scribe line 103, which is set up also between the device site region 102a and the periphery region 102b, and is labeled as dotted line in FIG. 1A and FIG. 1B, is where the right-angle cutting edge excises the substrate 100. As the slender slots are disposed at the four sides of the device site region 102a, the connections between the device site region 102a and the periphery region 102b are at the four corners of the device site region 102a only (only one corner of the device site region 102a is shown in FIG. 1A, and FIG. 1B).

What is more, in order to facilitate the singulating process, a "scribe line intersecting hole" 106 is set up in between the two adjacent slender slots 104 at each of the above-mentioned corners on the substrate 100.

Afterwards, a solder mask layer 114 is formed on both the top surface 100a and the bottom surface 100b of the substrate 100. On the substrate 100, the solder mask layer 114 exposes a bonding finger (not shown) on the top surface 100a and a solder ball pad 110 (see FIG. 3) on the bottom surface 102b. Noted that the solder mask 114 further exposes a top bare substrate area 116a (see FIG. 1A, FIG. 1B, and FIG. 2) and a bottom bare substrate area 116b (see FIG. 3) on the substrate 100 at the corners where the device site region 102a connects the periphery region 102b. In an embodiment of the present invention, the top bare substrate area 116a and bottom bare substrate area 116b exposed by the solder mask layer 114 are connected to the slender slots 104. They are disposed out of a region surrounded by the scribe line 103, and in the meantime, the solder mask layer 114 is thus divided into a "device site region solder mask layer" 114a and a "periphery region solder mask layer" 114b. The subsequent manufacturing processes, such as die mounting, wire bonding, encapsulating, and solder-ball planting etc., can generate crack lines 117 at the edge of the substrate 100. Besides, crack lines resulted from thermal stresses can also be generated due to the difference in thermal expansion between the two materials bonded together. The "device site region solder mask layer" 114a is thus basically isolated from the "periphery region solder mask layer" 114b by the slender slots 104, the top bare substrate area 116a, and the bottom bare substrate area 116b. Therefore, the crack lines 117 generated in the periphery region 102b will not develop into the device site region 102a and the encapsulated package, thereby, the problems of being relatively low in reliability and relatively low in yield can be resolved.

The material used by the solder mask layer 114, which is formed on the top surface 100a and bottom surface 100b of the substrate 100. includes an insulative material such as ultraviolet-ray type of solder mask and thermal hardening type of solder mask. The forming method of the solder mask layer includes roller coating, screen coating, screen-printing, dipping, and dry film etc. Subsequently, a portion of the solder mask layer 114 is removed, by a wet-etching method for example, to expose the top bare substrate area 116a and the bottom bare substrate area 116b. In this way, the solder mask 114 is divided into a "device site region solder mask layer" 114a and a "periphery region solder mask layer" 114b.

As shown in FIG. 1B, a series of packaging process is performed. Firstly, a die is bonded in the device site region 102a on the top surface 100a of the substrate 100. Then, the die is electrically connected to the substrate 100. Thereafter, a molding compound 118 is used to perform an encapsulating process in order to protect the die from being damaged and contaminated by the outside environment. Subsequently, a solder-ball planting process is performed to plant the solder balls on the solder ball pads 110.

Finally, a singulating process is performed to separate the device site region 102a from the substrate strip 100, thus a package of semiconductor is completed.

As shown in FIG. 1B, in general, crack lines 117 will be generated in the solder mask layer 114 at the perimeter of the substrate 100 by the subsequent processes of die attachment, wire bonding, encapsulating, and solder-ball planting etc. The crack lines 117 can also be generated due to the unequal thermal stresses resulting from the difference in the coefficient of thermal expansion of the bonding between the two different materials. The top bare substrate area 116a and the bottom bare substrate area 116b on the top and bottom surfaces 100a and 100b respectively on the substrate 100 enclose the device site region 102a. Consequently, the "device site region solder mask layer" 114a and "periphery region solder mask layer" 114b are separated. Hence, the crack lines 117 can not develop to the device site region 102a nor can they develop into the encapsulated packages. Therefore, the problems of being relatively low in yield and relatively low in reliability resulted from the crack line generation in the solder mask layer can thus be resolved.

In general, the crack lines are generated in the solder mask layer at the perimeter of the substrate 100 by the subsequent processes of die attachment, wire bonding, encapsulating, and solder-ball planting etc. The crack lines can also be generated due to the unequal thermal stresses resulting from the difference in the coefficient of thermal expansion of the bonding between the two different materials. According to a preferred embodiment of the present invention, a solder mask layer 114 is formed on the top and bottom surfaces 100a and 100b respectively on the substrate 100, and the solder mask layer 114 exposes a portion of the top and bottom surfaces of the substrate. The exposed portion of the top and bottom surfaces of the substrates divide the "device site region solder mask layer" 114a and "periphery region solder mask layer" 114b into two separate regions. Hence, the crack lines can not develop to the device site region nor can they develop into the encapsulated packages. Therefore, the problems of being relatively low in yield and relatively low in reliability resulted from the crack line generation in the solder mask layer can thus be resolved.

Figure 4:
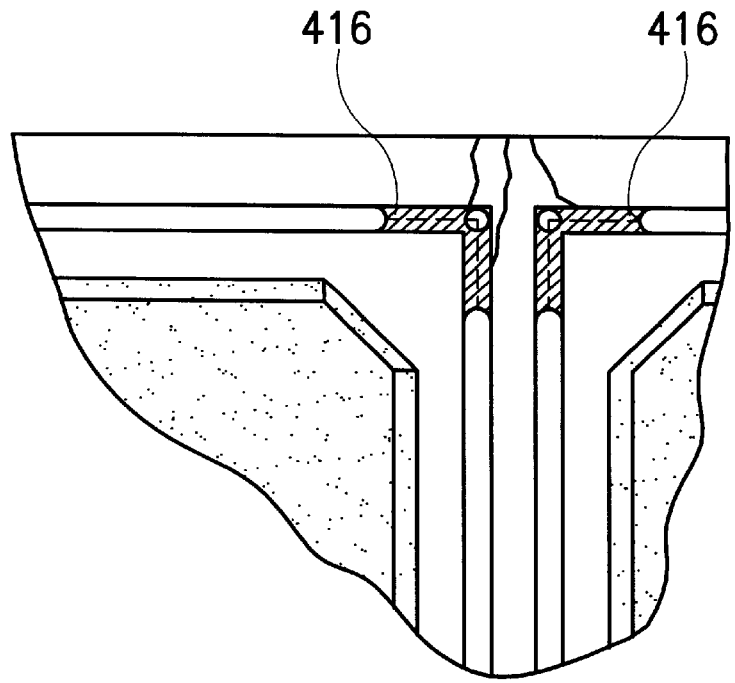
FIG. 4 is a top view of an enlarged corner portion of top surface of the substrate strip having the packaging process completed of an embodiment of the present invention.
Figure 5:
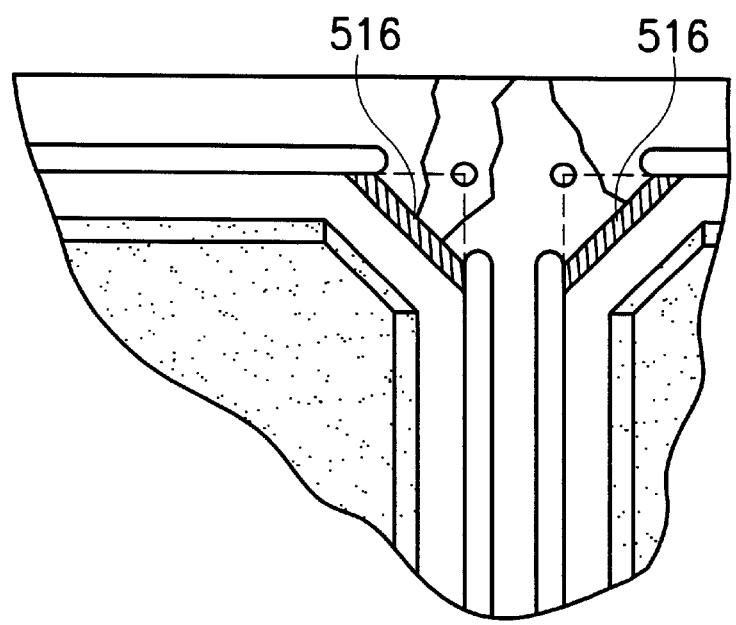
FIG. 5 is a top view of an enlarged corner portion of top surface of the substrate strip having the packaging process completed of another embodiment of the present invention.

In a preferred embodiment of the present invention, the bare area at the intersection of the device site region and the periphery region is exposed on the substrate, and the scribe line is used in the singulating process. The bare area is to indicate that the exposed surface of the substrate divides the solder mask layer into a "device site region solder mask layer" and a "periphery region solder mask layer". But in the practical application, the bare area on the substrate is not limited to the intersection of the device site region and the periphery region, nor is it limited to the region out of the region enclosed by the scribe line as shown in FIG. 1A. In other words, the bare area on the substrate can be on the scribe line as the bare area 416 shown in FIG. 4, or within the region enclosed by the scribe line as the bare area 516 shown in FIG. 5. Besides, the bare area on the substrate can be disposed in the device site region to attain the objectives of stopping the development of the crack lines into the device site region and exposing the circuit region.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A crack-preventive substrate, comprising:
    a substrate having a top surface and a bottom surface, wherein the substrate is divided into a device site region and a periphery region; and
    a solder mask layer disposed on the top surface and bottom surface of the substrate to expose external connections on the top surface and the bottom surface, wherein bare areas which are not covered with the solder mask are formed on the top surface and bottom surface of the substrate, respectively, at the locations where the device site region and the periphery region are connected.

2. The crack-preventive substrate of claim 1 wherein the solder mask layer is an ultraviolet-ray type of solder mask layer.

3. The crack-preventive substrate of claim 1 wherein the bare area is disposed out of the device site region.

4. A crack-preventive substrate, comprising:
    a substrate, having a top surface and a bottom surface wherein the substrate comprises a device site region and a periphery region, and a slender slot is formed on each of four sides of the device site region leaving only the four corners where the device site region and the periphery region are connected; and
    a solder mask layer disposed on the top surface and bottom surface of the substrate to expose external connections on the top surface and the bottom surface, wherein bare areas which are not covered with the solder mask are formed at the corners of the top surface and bottom surface of the substrate, respectively.

5. The crack-preventive substrate of claim 4 wherein the solder mask layer is an ultraviolet-ray type of solder mask layer.

6. A process for fabricating a semiconductor package, comprising:
    providing a substrate which has a top surface and a bottom surface, and the substrate also comprises a device site region and a periphery region;
    forming a solder mask layer on the top surface and bottom surface of the substrate to expose external connections on the top surface and the bottom surface, wherein bare areas which are not covered with the solder mask are formed on the top surface and bottom surface of the substrate, respectively, at the locations where the device site region and the periphery region are connected;
    mounting a die in the device site region on the top surface of the substrate;
    performing an encapsulating process in the device site region on the top surface of the substrate;
    performing a solder-ball planting process; and
    performing a singulating process to separate the device site region and the periphery region.

7. The process of claim 6, wherein the bare areas are formed by removing a portion of the solder mask layer by the use of wet etching method.

8. The process of claim 7, further comprises a screen-printing.

9. The process of claim 6, wherein the solder mask layer is an ultraviolet-ray type solder mask layer.

10. A process for fabricating a semiconductor package, comprising:
    providing a substrate which has a top surface and a bottom surface, and the substrate also comprises a device site region and a periphery region wherein a slender slot is formed on the substrate on each side of the device site region leaving the four corners thereof for connecting the device site region and the periphery region;
    forming a solder mask layer on the top surface and bottom surface of the substrate to expose external connections on the top surface and the bottom surface, wherein bare areas which are not covered with the solder mask are formed at the corners of the top surface and bottom surface of the substrate, respectively;
    mounting a die in the device site region on the top surface of the substrate;
    performing an encapsulating process in the device site region on the top surface of the substrate;
    performing a solder-ball planting process; and
    performing a singulating process to separate the device site region and the periphery region.

11. The process of claim 10, further comprises a screen-printing.

12. The process of claim 10, wherein the solder mask layer is an ultraviolet-ray type solder mask layer.

13. The process of claim 10, wherein the process for removing the solder mask layer comprises wet etching.

14. A crack-preventive process for fabricating a solder mask in a device site region. comprising:
    providing a substrate which has a top surface and a bottom surface, and the substrate also comprises a device site region and a periphery region;
    forming a solder mask layer, by screen-printing, on the top surface and bottom surface of the substrate wherein the solder mask layer forms a bare area on the top surface and bottom surface of the substrate by exposing a portion of the substrate on the top surface and bottom surface of the substrate, and the bare areas divide the solder mask layer into a "device site region solder mask layer" and a "periphery region solder mask layer", wherein the bare areas are formed by removing a portion of the solder mask layer with a wet etching method;
    mounting a die in the device site region on the top surface of the substrate;
    performing an encapsulating process in the device site region on the top surface of the substrate;

performing a solder-ball planting process; and performing a singulating process to separate the device site region and the periphery region.

15. A crack-preventive process for fabricating a solder mask in a device site region comprising:

providing a substrate which has a top surface and a bottom surface and comprises a device site region and a periphery region wherein a slender slot is formed on the substrate on each side of the device site region leaving the four corners for connecting the device site region and the periphery region;

forming a solder mask layer, by screen-printing, on the top surface and the bottom surface of the substrate;

forming a bare area by removing a portion of the solder mask layer to expose the top and bottom surfaces of the substrate at the intersection of the device site region and the periphery region wherein the bare area combining the adjacent slender slots divides the solder mask layer into a "device site region solder mask layer" and a "periphery region solder mask layer";

mounting a die in the device site region on the top surface of the substrate;

performing an encapsulating process in the device site region on the top surface of the substrate;

performing a solder-ball planting process; and performing a singulating process to separate the device site region and the periphery region.

* * * * *